United States Patent
Wang et al.

(10) Patent No.: US 11,362,676 B2
(45) Date of Patent: Jun. 14, 2022

(54) DATA ENCODING AND DECODING METHODS AND APPARATUSES

(71) Applicant: HUAWEI TECHNOLOGIES CO., LTD., Guangdong (CN)

(72) Inventors: Guijie Wang, Hangzhou (CN); Gongzheng Zhang, Hangzhou (CN); Yunfei Qiao, Hangzhou (CN); Jian Wang, Hangzhou (CN); Chaolong Zhang, Hangzhou (CN); Rong Li, Hangzhou (CN)

(73) Assignee: Huawei Technologies Co., Ltd., Shenzhen (CN)

(*) Notice: Subject to any disclaimer, the term of this patent is extended or adjusted under 35 U.S.C. 154(b) by 342 days.

(21) Appl. No.: 16/505,200

(22) Filed: Jul. 8, 2019

(65) Prior Publication Data
US 2019/0334553 A1 Oct. 31, 2019

Related U.S. Application Data (63) Continuation of application No. PCT/CN2018/071616, filed on Jan. 5, 2018.

(30) Foreign Application Priority Data

Jan. 7, 2017 (CN) .......................... 201710011631.7

(51) Int. Cl.
*H03M 13/13* (2006.01)
*H03M 13/45* (2006.01)
(Continued)

(52) U.S. Cl.
CPC .......... *H03M 13/13* (2013.01); *H03M 13/45* (2013.01); *H03M 13/616* (2013.01)

(58) Field of Classification Search
None
See application file for complete search history.

(56) References Cited

U.S. PATENT DOCUMENTS 6,385,671 B1 * 5/2002 Hunsaker .............. G06F 13/28
370/300
2010/0303011 A1 12/2010 Pan et al.
(Continued)

FOREIGN PATENT DOCUMENTS

CN 101547064 A 9/2009
CN 102164025 A 8/2011
(Continued)

OTHER PUBLICATIONS

Extended European Search Report issued in European Application No. 18735815.5 dated Nov. 27, 2019, 12 pages.
(Continued)

*Primary Examiner* — April Y Blair
*Assistant Examiner* — Dipakkumar B Gandhi
(74) *Attorney, Agent, or Firm* — Fish & Richardson P.C.

(57) ABSTRACT

Embodiments of the application provides a method for encoding. The method includes: receiving a to-be-encoded data block; encoding the data block at an aggregation level of 2L, where a formula used during the encoding is as follows:

$$[\dot{u}_{2L} \ \dot{u}_L]\begin{bmatrix} G_{LN} & 0 \\ G_{LN} & G_{LN} \end{bmatrix} = \lfloor \dot{c}_{2L} \ \dot{c}_L \rfloor \quad (I)$$

$$\dot{u}_L = \{u_L \ u_{L-1} \ \ldots \ u_1\}, \dot{u}_{2L} = \{u_{2L} \ u_{2L-1} \ \ldots \ u_{L+1}\}, \dot{c}_L = \quad (II)$$

$$\{c_L \ c_{L-1} \ \ldots \ c_1\}, \dot{c}_{2L} = \{c_{2L} \ c_{2L-1} \ \ldots \ c_{L+1}\}, G_{LN} = G_N^{\oplus \log_2^{(L)}}$$

(Continued)

$L=2^n$, and n is a natural number greater than or equal to 0; and outputting an encoded data block.

25 Claims, 6 Drawing Sheets

(51) Int. Cl.
*H03M 13/00* (2006.01)
*H03M 13/33* (2006.01)

(56) References Cited

U.S. PATENT DOCUMENTS

| | | |
|---|---|---|
| 2013/0205176 A1 | 8/2013 | Qian et al. |
| 2014/0019820 A1* | 1/2014 | Vardy .................. H03M 13/13 714/752 |
| 2015/0026543 A1 | 1/2015 | Li et al. |
| 2015/0077277 A1* | 3/2015 | Alhussien ............... H03M 7/40 341/67 |
| 2015/0293716 A1* | 10/2015 | Jiang .................. G06F 11/1012 711/154 |
| 2016/0164629 A1* | 6/2016 | Ahn .................... H04L 63/0428 714/776 |
| 2016/0254876 A1* | 9/2016 | Shen .................... H04L 1/0043 714/776 |
| 2017/0005753 A1 | 1/2017 | Shen et al. |

FOREIGN PATENT DOCUMENTS

| | | |
|---|---|---|
| CN | 103368583 A | 10/2013 |
| CN | 105075163 A | 11/2015 |
| CN | 105453466 A | 3/2016 |
| CN | 105743621 A | 7/2016 |
| CN | 105874736 A | 8/2016 |
| EP | 3113400 A1 | 1/2017 |
| GB | 2331897 A | 6/1999 |

OTHER PUBLICATIONS

Li et al., "Parallel Decoders of Polar Codes," arXiv preprint arXiv:1309.1026, XP055239917, Sep. 4, 2013, pp. 1-4.
Vangala et al., "A New Multiple Folded Successive Cancellation Decoder for Polar Codes," 2014 IEEE Information Theory Workshop (ITW 2014), IEEE, XP032694569, Nov. 2, 2014. pp. 381-385.
Office Action issued in Chinese Application No. 201710011631.7 dated Dec. 29, 2020, 20 pages.
PCT International Search Report and Written Opinion in International Application No. PCT/CN2018/071,616, dated Apr. 4, 2018, 22 pages (With English Translation).
Office Action issued in Chinese Application No. 201710011631.7 dated Oct. 9, 2021, 4 pages.

* cited by examiner

DATA ENCODING AND DECODING METHODS AND APPARATUSES

CROSS-REFERENCE TO RELATED APPLICATIONS

This application is a continuation of International Application No. PCT/CN2018/071616, filed on Jan. 5, 2018, which claims priority to Chinese Patent Application No. 201710011631.7, filed on Jan. 7, 2017. The disclosures of the aforementioned patent applications are hereby incorporated by reference in their entireties.

TECHNICAL FIELD

Embodiments of the present invention relate to the fields of electronic and communications technologies, and more specifically, to data encoding and decoding methods and apparatuses.

BACKGROUND

In a communications system, an encoding technology is usually used to improve data transmission reliability and ensure communication quality. A polar code (English translation: Polar code) algorithm is theoretically proved to be the first encoding and decoding algorithm that can achieve a Shannon capacity and has low coding-decoding complexity (coding-decoding complexity is O(N log N)).

Currently, in an encoding process using the polar code algorithm, how to construct a data block at a specific aggregation level to match a specific rate is a problem urgently needing to be resolved at present.

SUMMARY

Embodiments of the present invention provide data encoding and decoding methods and apparatuses, to construct a data block at a specific aggregation level in an encoding process using a polar code algorithm, so as to match a specific rate.

According to a first aspect, a data encoding method is provided. The method includes:

receiving a to-be-encoded data block;

encoding the data block at an aggregation level of 2L, where a formula used during the encoding is as follows:

$$[\dot{u}_{2L}\ \dot{u}_L]\begin{bmatrix}G_{LN} & 0 \\ G_{LN} & G_{LN}\end{bmatrix} = [\dot{c}_{2L}\ \dot{c}_L],$$

where $\dot{u}_L = \{u_L\ u_{L-1}\ \ldots\ u_1\}$, $\dot{u}_{2L} = \{u_{2L}\ u_{2L-1}\ \ldots\ u_{L+1}\}$, $\dot{c}_L = \{c_L\ c_{L-1}\ \ldots\ c_1\}$, $\dot{c}_{2L} = \{c_{2L}\ c_{2L-1}\ \ldots\ c_{L+1}\}$, $G_{LN} = G_N^{\otimes \log_2(L)}$, $L=2^n$, n is a natural number greater than or equal to 0, $G_N$ is a coding matrix of a polar code having a length of N, u with a subscript indicates the to-be-encoded data block, the subscript of u indicates an order in which the to-be-encoded data block is arranged based on a polar construction sequence, and c with a subscript indicates an encoded data block; and outputting the encoded data block.

In the embodiment of the data encoding method, in the encoding formula, $\dot{u}_L = \{u_L\ u_{L-1}\ \ldots\ u_1\}$, and $\dot{u}_{2L} = \{u_{2L}\ u_{2L-1}\ \ldots\ u_{L+1}\}$. It can be learned that, a data block to be encoded at a higher aggregation level is nested with a data block to be encoded at a lower aggregation level. In this way, in a decoding process, after the data block to be encoded at the lower aggregation level that is nested in the data block to be encoded at the higher aggregation level is decoded, an information bit carried in the data block to be encoded at the higher aggregation level is already decoded. Therefore, it is unnecessary to continue the decoding, thereby effectively reducing a decoding delay and stopping the decoding early.

In a first possible implementation of the first aspect, values in X bits in $\dot{u}_L$ are the same as values in X bits in $\dot{u}_{2L}$, information in at least one bit in $\dot{u}_{2L}$ except the X bits is a frozen bit and/or a check frozen bit, and X is a natural number greater than 0.

In the embodiment of the data encoding method, there are K information bits in $\dot{u}_L$, values in X bits in the K information bits are the same as the values in the X bits in $\dot{u}_{2L}$, X≤K, X is a natural number greater than 0, and information in the X bits in $\dot{u}_L$ is a check frozen bit. In this way, in an encoding process, a result of encoding a group of data blocks at a higher aggregation level is different from a result of encoding the group of data blocks at a lower aggregation level, bringing an encoding gain. In this way, in the embodiment of the data encoding method, when the aggregation level is greater than 1, there may be a full encoding gain caused by an increase in a code length and a decrease in a code rate.

With reference to the first aspect or the first possible implementation of the first aspect, in a second possible implementation, information in all bits in $\dot{u}_{2L}$ except the X bits is a frozen bit and/or a check frozen bit.

With reference to any one of the first aspect or the first and second possible implementations of the first aspect, in a third possible implementation, the X bits in $\dot{u}_{2L}$ are located in any positions in $\dot{u}_{2L}$, and the X bits in $\dot{u}_L$ are located in any positions in $\dot{u}_L$.

With reference to any one of the first aspect or the first to third possible implementations of the first aspect, in a fourth possible implementation, polarization channel reliability at positions of the X bits in $\dot{u}_{2L}$ is higher than or equal to reliability at positions of the X bits in $\dot{u}_L$, and the polarization channel reliability is a polarization weight of each polarization channel.

An information bit at a position with lower reliability in $\dot{u}_L$ and an information bit at a position with higher reliability in $\dot{u}_{2L}$ are repeated, to ensure to the greatest extent that the duplicated information bit is still located at a position with relatively high reliability, thereby obtaining an encoding gain.

With reference to any one of the first aspect or the first to fourth possible implementations of the first aspect, in a fifth possible implementation, a value in at least one bit in at least one of data blocks u with subscripts greater than 1 is the same as a value in at least one bit storing a check frozen bit in a data block $u_1$.

With reference to any one of the first aspect or the first to fifth possible implementations of the first aspect, in a sixth possible implementation, there are a total of K information bits in $\dot{u}_L$ and $\dot{u}_{2L}$, K is a natural number greater than 0, X≤K<N, and N indicates a length of an encoded mother code when L=1.

With reference to any one of the first aspect or the first to sixth possible implementations of the first aspect, in a seventh possible implementation, information in the X bits in $\dot{u}_L$ is a check frozen bit.

According to a second aspect, an embodiment of the present invention further provides a data decoding method, including: receiving LLR (Log-likelihood ratio, log-likelihood ratio) information corresponding to some encoded data blocks at an aggregation level of 2L, where the some encoded data blocks are data blocks that are encoded at an aggregation level lower than 2L, L=2$^n$, and n is a natural number greater than or equal to 0;

decoding the LLR information at the aggregation level lower than 2L; and outputting a decoding result of the LLR information.

In the embodiment of the data decoding method, K information bits are also carried; when encoding is performed at different aggregation levels, a receive end (for example, a terminal) performs decoding at a lower aggregation level first, and when the decoding succeeds at the lower aggregation level, does not need to read an LLR at a higher aggregation level for decoding, thereby effectively reducing a decoding delay and stopping the decoding early. Further, based on the data decoding method in this embodiment of the present invention, even if the data block is encoded at the aggregation level of 2L, decoding may succeed at an aggregation level of L or even lower. In this way, in a decoding process, it is unnecessary to traverse all possible aggregation levels for detection. Therefore, a quantity of blind detection is effectively reduced.

In a first possible implementation of the second aspect, the encoded data block at the aggregation level of 2L is obtained by encoding a data block at the aggregation level of 2L.

With reference to the second aspect or the first possible implementation of the second aspect, in a second possible implementation, the data block that is encoded at the aggregation level lower than 2L is obtained by encoding a data block at the aggregation level lower than 2L.

With reference to any one of the second aspect or the first and second possible implementations of the second aspect, in a third possible implementation, the decoding the LLR information at the aggregation level lower than 2L includes:

decoding the LLR information corresponding to the data block that is encoded at the aggregation level lower than 2L.

With reference to any one of the second aspect or the first to third possible implementations of the second aspect, in a fourth possible implementation, the decoding result includes an original data block before the data block is encoded at the aggregation level lower than 2L.

With reference to any one of the second aspect or the first to fourth possible implementations of the second aspect, in a fifth possible implementation, the decoding result includes decoded data blocks $\dot{u}_L$ and $\dot{u}_{2L}$, L, $\dot{u}_L=\{u_L \ u_{L-1} \ \ldots \ u_1\}$, $\dot{u}_{2L}=\{u_{2L} \ u_{2L-1} \ \ldots \ u_{L+1}\}$, u with a subscript indicates a to-be-encoded data block, the subscript of u indicates an order in which the to-be-encoded data block is arranged based on a polar construction sequence, values in X bits in $\dot{u}_L$ are the same as values in X bits in $\dot{u}_{2L}$, information in at least one bit in $\dot{u}_{2L}$ except the X bits is a frozen bit and/or a check frozen bit, and X is a natural number greater than 0.

With reference to any one of the second aspect or the first to fifth possible implementations of the second aspect, in a sixth possible implementation, there are a total of K information bits in $\dot{u}_L$ and $\dot{u}_{2L}$, K is a natural number greater than 0, X≤K<N, and N indicates a length of an encoded mother code when L=1.

With reference to any one of the second aspect or the first to sixth possible implementations of the second aspect, in a seventh possible implementation, information in the X bits in $\dot{u}_L$ is a check frozen bit.

Another aspect of the embodiments of this application further provides Embodiment 1 of an encoder, including an interface module and an encoding module, where the interface module is configured to receive a to-be-encoded data block;

the encoding module is configured to encode the data block at an aggregation level of 2L, where a formula used during the encoding is as follows:

$$[\dot{u}_{2L} \ \dot{u}_L]\begin{bmatrix} G_{LN} & 0 \\ G_{LN} & G_{LN} \end{bmatrix} = \lfloor \dot{c}_{2L} \ \dot{c}_L \rfloor,$$

where $\dot{u}_L=\{u_L \ u_{L-1} \ \ldots \ u_1\}$, $\dot{u}_{2L}=\{u_{2L} \ u_{2L-1} \ \ldots \ u_{L+1}\}$, $\dot{c}_L=\{c_L \ c_{L-1} \ \ldots \ c_1\}$, $\dot{c}_{2L}=\{c_{2L} \ c_{2L-1} \ \ldots \ c_{L+1}\}$, $G_{LN}=G_N^{\otimes \log_2(L)}$, L=2$^n$, n is a natural number greater than or equal to 0, $G_N$ is a coding matrix of a polar code having a length of N, u with a subscript indicates the to-be-encoded data block, the subscript of u indicates an order in which the to-be-encoded data block is arranged based on a polar construction sequence, and c with a subscript indicates an encoded data block; and the interface module is further configured to output the encoded data block.

The encoder provided in this embodiment of the present invention may be configured to perform various embodiments of the data encoding method, and implementation principles and technical effects of the encoder and the data encoding method are similar. Details are not described herein again.

Another aspect of the embodiments of this application further provides Embodiment 2 of an encoder, including at least one circuit board, and a processor, a memory, and a bus that are disposed on the at least one circuit board, where the processor is connected to the memory by using the bus, and when the encoder is operating, the processor reads and executes an instruction in the memory or runs a hardware logical circuit of the processor, so that the encoder performs various embodiments of the data encoding method.

In an optional implementation, in Embodiment 2 of the encoder, the memory and the processor may be located in a same circuit board, or the memory and the processor may be located in different circuit boards.

Another aspect of the embodiments of this application further provides Embodiment 3 of an encoder, including at least one circuit board, and a processor, a memory, and a bus that are disposed on the at least one circuit board, where the processor is connected to the memory by using the bus, and when Embodiment 3 of the encoder is operating, the processor reads and executes an instruction in the memory or runs a hardware logical circuit of the processor, so that Embodiment 3 of the encoder implements functions in various implementations of the interface module and the encoding module in Embodiment 1 of the encoder.

In an optional implementation, in Embodiment 3 of the encoder, the memory and the processor may be located in a same circuit board, or the memory and the processor may be located in different circuit boards.

Another aspect of the embodiments of this application further provides Embodiment 1 of a decoder, including a transceiver module and a decoding module, where the transceiver module is configured to receive LLR information corresponding to some encoded data blocks at an aggregation level of 2L, where the some encoded data blocks are data blocks that are encoded at an aggregation level lower than 2L, L=2$^n$, and n is a natural number greater than or equal to 0;

the decoding module is configured to decode the LLR information at the aggregation level lower than 2L; and the transceiver module is further configured to output a decoding result of the LLR (Log-likelihood ratio, log-likelihood ratio) information.

Embodiment 1 of the decoder provided in this embodiment of the present invention may be configured to perform various embodiments of the data decoding method, and implementation principles and technical effects of the decoder and the data decoding method are similar. Details are not described herein again.

Another aspect of the embodiments of this application further provides Embodiment 2 of a decoder, including at least one circuit board, and a processor, a memory, and a bus that are disposed on the at least one circuit board, where the processor is connected to the memory by using the bus, and when Embodiment 2 of the decoder is operating, the processor reads and executes an instruction in the memory or runs a hardware logical circuit of the processor, so that the decoder performs various embodiments of the data decoding method.

In an optional implementation, in Embodiment 2 of the decoder, the memory and the processor may be located in a same circuit board, or the memory and the processor may be located in different circuit boards.

Another aspect of the embodiments of this application further provides Embodiment 3 of a decoder, including at least one circuit board, and a processor, a memory, and a bus that are disposed on the at least one circuit board, where the processor is connected to the memory by using the bus, and when Embodiment 3 of the decoder is operating, the processor reads and executes an instruction in the memory or runs a hardware logical circuit of the processor, so that Embodiment 3 of the decoder implements various implementations of functions of the transceiver module and the decoding module in Embodiment 1 of the decoder.

In an optional implementation, in Embodiment 3 of the decoder, the memory and the processor may be located in a same circuit board, or the memory and the processor may be located in different circuit boards.

Another aspect of the embodiments of this application further provides a computer-readable storage medium, where the computer-readable storage medium stores an instruction, and when the instruction is running on a computer, the computer is enabled to perform the methods according to the foregoing aspects.

Another aspect of the embodiments of this application further provides a computer program product including an instruction, where when the computer program product is running on a computer, the computer is enabled to perform the methods according to the foregoing aspects.

DESCRIPTION OF EMBODIMENTS

A data block constructed through encoding using a polar code algorithm is a linear block code. A matrix used during encoding is $G_N$, and an encoding process of a polar code is $x_1^N = u_1^N G_N$, where $u_1^N = \{m_1, m_2, \ldots, m_N\}$ $u_1^N$ is a binary row vector having a length of N, to be specific, a code length is N, $G_N$ is an N×N matrix, $G_N = F_2^{\otimes(log_2(N))}$, $$F_2 = \begin{bmatrix} 1 & 0 \\ 1 & 1 \end{bmatrix},$$

and $F_2^{\otimes(log_2(N))}$ is defined as a Kronecker (English translation: Kronecker) product of $log_2(N)$ matrices $F_2$. An addition operation and a multiplication operation performed in the encoding process by using the polar code algorithm that is described above are respectively an addition operation and a multiplication operation based on a binary Galois field (English translation: Galois Field).

In the encoding process using the polar code algorithm, some bits in $u_1^N$ are used to carry information, and are referred to as information bits, and a set of indexes of the information bits is represented by A. The other bits are set to constant values that are pre-agreed on by a transmit end and a receive end, and are referred to as fixed bits or frozen bits, and a set of indexes of the constant bits is represented by a complementary set $A^c$ of A. Without loss of generality, these constant bits are usually set to 0, and the constant bits may be randomly set. In this way, an output of the encoding using the polar code algorithm may be simplified as: $x_1^N = u_A G_N(A)$ where $u_A$ is a set of information bits in $u_1^N$, $u_A$ is a row vector having a length of K, to be specific, |A|=K, |•| indicates a quantity of elements in the set, K is a quantity of the information bits, $G_N(A)$ is a sub matrix obtained by using rows corresponding to the indexes in the set A in the matrix $G_N$, and $G_N(A)$ is a K×N matrix.

Figure 1:
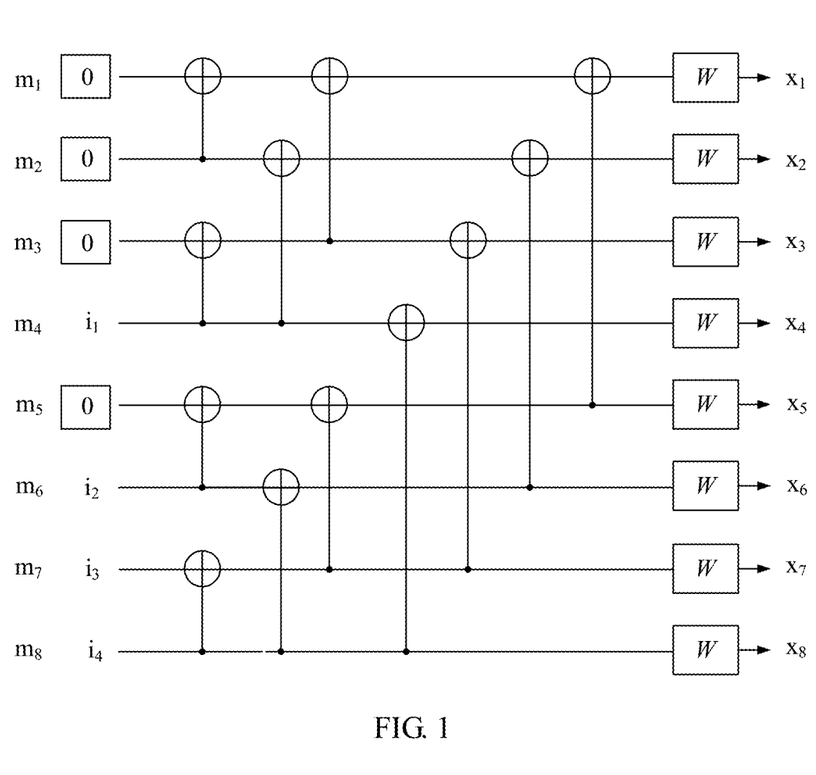
FIG. 1 is a schematic diagram of a frozen bit and an information bit in a used polar code algorithm according to an embodiment of the present invention.

As shown in FIG. 1, $\{m_1, m_2, m_3, m_5\}$ are set as frozen bits, $\{m_4, m_6, m_7, m_8\}$ are set as information bits, and four information bits in an information vector having a length of 4 are encoded into eight encoded bits. After the foregoing encoding, an encoded binary vector having a length of N (the encoded bits) is modulated and then transmitted through a channel.

The polar code algorithm is based on a channel polarization (English translation: Channel Polarization) phenomenon, to obtain, by using a constructive encoding method, a data block approximating a channel capacity. Common construction methods include a method for calculating polarization channel reliability that includes density evolution (English translation: density evolution, DE for short), Gaussian approximation (English translation: Gaussian approximation, GA for short), linear fitting, a polarization weight, and other methods. In the encoding process using the polar code algorithm, a process of selecting the set A determines, to some extent, performance of a data block that is encoded by using the polar code algorithm. It can be learned from the coding matrix that, a code length of the data block that is encoded by using the polar code algorithm is an integer power of 2.

Compared with a conventional polar code and a CRC (Cyclic Redundancy Check, cyclic redundancy check) auxiliary polar code, a PC (Parity-Check) polar code has a larger code distance and better BLER (Block Error Rate) performance when an SCL (Successive Cancellation List) decoding algorithm is used, and therefore has better application potential. For the PC polar code, before polar encoding is performed, check precoding is first performed on an information bit. A precoding process is briefly described as follows: A check equation is an equation that associates an information bit with a check bit. If the check equation is represented in a form of a vector, the last one of members of the check equation is a check bit. A value of the check bit is addition modulo 2 of other members of the check equation. For example, if the check equation is [1 3 5 7], the subchannels 1, 3 and 5 are information subchannels. If values of the subchannels are respectively $m_1$, $m_3$, $m_5$, the value of the check bit is $m_2 = \mod(m_1+m_3+m_5, 2)$.

The foregoing various polar codes such as the PC polar code and the CRC polar code are all applicable to the embodiments of the present invention.

Figure 2:
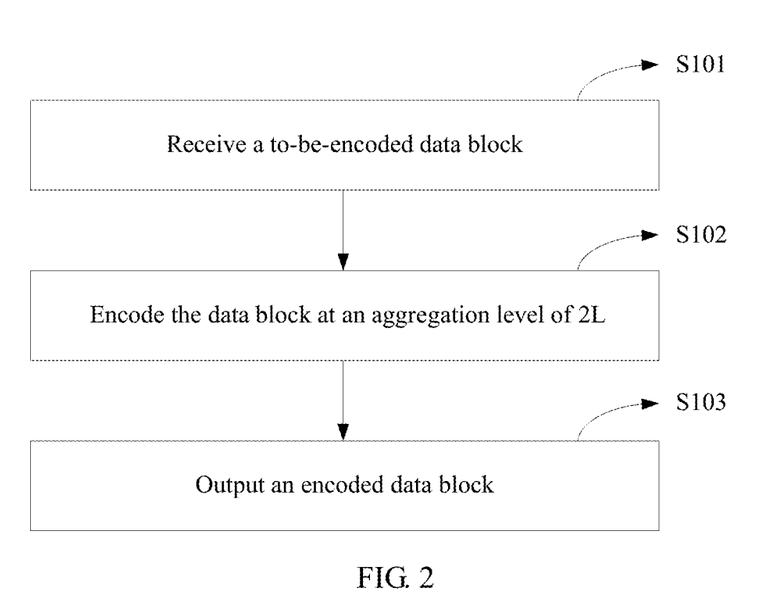
FIG. 2 is a schematic diagram of a data encoding method according to an embodiment of the present invention.

As shown in FIG. 2, an embodiment of the present invention provides a data encoding method, including the following steps:

S101. Receive a to-be-encoded data block.

S102. Encode the data block at an aggregation level of 2L, where a formula used during the encoding is as follows:

$$[\dot{u}_{2L} \ \dot{u}_L] \begin{bmatrix} G_{LN} & 0 \\ G_{LN} & G_{LN} \end{bmatrix} = [\dot{c}_{2L} \ \dot{c}_L],$$

where $\dot{u}_L = \{u_L \ u_{L-1} \ \ldots \ u_1\}$, $\dot{u}_{2L} = \{u_{2L} \ u_{2L-1} \ \ldots \ u_{L+1}\}$, $\dot{c}_L = \{c_L \ c_{L-1} \ \ldots \ c_1\}$, $\dot{c}_{2L} = \{c_{2L} \ c_{2L-1} \ \ldots \ c_{L+1}\}$, $G_{LN} = G_N^{\otimes \log_2(L)}$, $L = 2^n$, n is a natural number greater than or equal to 0, $G_N$ is a coding matrix of a polar code having a length of N, u with a subscript indicates the to-be-encoded data block, the subscript of u indicates an order in which the to-be-encoded data block is arranged based on a polar construction sequence, and c with a subscript indicates an encoded data block.

S103. Output the encoded data block.

In the embodiment of the data encoding method, each aggregation level is a power of 2.

In the embodiment of the data encoding method, in an encoding process at a particular aggregation level, in the foregoing encoding formula, $\dot{c}_L = \{c_L \ c_{L-1} \ \ldots \ c_1\}$, and $\dot{c}_{2L} = \{c_{2L} \ c_{2L-1} \ \ldots \ c_{L+1}\}$. It can be learned that, a data block that is encoded at a higher aggregation level includes a data block that is encoded at a lower aggregation level; or it may be considered that a data block that is encoded at a higher aggregation level is nested with a data block that is encoded at a lower aggregation level. It can be more clearly learned by listing cases of different values of L that when the aggregation level is 1, $u_1 G_N = c_1$. When the aggregation level is 2, to be specific, when L=1, $$[u_2 \ u_L] \begin{bmatrix} G_N & 0 \\ G_N & G_{LN} \end{bmatrix} = [c_2 \ c_1].$$

When the aggregation level is 4, to be specific, when L=2, $$[u_4 \ u_3 \ u_2 \ u_1] \begin{bmatrix} G_N & 0 & 0 & 0 \\ G_N & G_N & 0 & 0 \\ G_N & 0 & G_N & 0 \\ G_N & G_N & G_N & G_N \end{bmatrix} = [c_4 \ c_3 \ c_2 \ c_1].$$

In the encoding process, a higher aggregation level that is used indicates a lower code rate. It can be learned from $\dot{u}_L = \{u_L \ u_{L-1} \ \ldots \ u_1\}$, and $\dot{u}_{2L} = \{u_{2L} \ u_{2L-1} \ \ldots \ u_{L+1}\}$ that, at least one data block to be encoded at a higher aggregation level is nested with at least one data block to be encoded at a lower aggregation level, and correspondingly, at least one data block that is encoded at a higher aggregation level is nested with at least one data block that is encoded at a lower aggregation level. It may also be understood that, the at least one data block to be encoded at the lower aggregation level is a subset of the at least one data block to be encoded at the higher aggregation level. In a process of decoding the at least one encoded data block, after the at least one data block to be encoded at the lower aggregation level that is nested in the at least one data block to be encoded at the higher aggregation level is decoded, an information bit carried in the at least one data block to be encoded at the higher aggregation level is already decoded. Therefore, it is unnecessary to continue the decoding, thereby effectively reducing a decoding delay and stopping the decoding early.

When being encoded at different aggregation levels, the to-be-encoded data block is described as follows.

In the embodiment of the data encoding method, values in X bits in $\dot{u}_L$ are the same as values in X bits in $\dot{u}_{2L}$, information in at least one bit in $\dot{u}_{2L}$ except the X bits is a frozen bit and/or a check frozen bit, and X is a natural number greater than 0.

In the embodiment of the data encoding method, there are a total of K information bits in $\dot{u}_L$ and $\dot{u}_{2L}$, K is a natural number greater than 0, X≤K<N, and N indicates a length of an encoded mother code when L=1.

In the embodiment of the data encoding method, information in the X bits in $\dot{u}_L$ is a check frozen bit.

In the embodiment of the data encoding method, a value in at least one bit in at least one of data blocks u with subscripts greater than 1 is the same as a value in at least one bit storing a check frozen bit in a data block $u_1$. For example, a data block u with a subscript greater than 1 may be any one or more of $u_2$, $u_3$, $u_4$, $u_5$, $u_6$, $u_7$, and $u_8$.

In the embodiment of the data encoding method, information in all bits in $\dot{u}_{2L}$ except the X bits is a frozen bit and/or a check frozen bit.

In the embodiment of the data encoding method, the X bits in $\dot{u}_{2L}$ are located in any positions in $\dot{u}_{2L}$, and the X bits in $\dot{u}_L$ are located in any positions in $\dot{u}_L$.

In the embodiment of the data encoding method, polarization channel reliability at positions of the X bits in $\dot{u}_{2L}$ is higher than or equal to reliability at positions of the X bits in $\dot{u}_L$, and the polarization channel reliability is a polarization weight of each polarization channel.

Calculating polarization weights (reliability) of N polarization channels includes:

calculating polarization weights $W_i$ of the N polarization channels according to the following formula, to obtain a first polarization weight vector:

$$W_i = \sum_{j=0}^{n-1} B_j * (2^j + \phi)^{\alpha};$$

where $i = B_{n-1} B_{n-2} \ldots B_0$, i is a channel index, $B_{n-1} B_{n-2} \ldots B_0$ is a binary representation of i, $B_{n-1}$ is the most significant bit, $B_0$ is the least significant bit, $B_j \in \{0,1\}$, $j \in \{0, 1, \ldots, n-1\}$, $i \in \{0, 1, \ldots, n-1\}$, $N=2^n$, $\phi$ is a target code length based on first data transmission, $\alpha$ is a parameter preset for a code rate of the first data transmission, and n is a positive integer.

An information bit at a position with lower reliability in $\dot{u}_L$ and an information bit at a position with higher reliability in $\dot{u}_{2L}$ are repeated, to ensure to the greatest extent that the duplicated information bit is still located at a position with relatively high reliability, thereby bringing an encoding gain. In this way, in a process of transferring the encoded data block, because of the lower reliability, the information bit at the position with the lower reliability in $\dot{u}_L$ is easily lost, while the information bit at the position with the higher reliability in $\dot{u}_{2L}$ is not easily lost. In this way, in the decoding process, even if the information bit at the position with the lower reliability in $\dot{u}_L$ is lost, a same bit can be found from the information bit at the position with the higher reliability in $\dot{u}_{2L}$, thereby obtaining a complete information bit after the decoding.

In the embodiment of the data encoding method, specifically, u indicates a to-be-encoded data block, u with a subscript of "1" indicates a data block ranked first in a construction sequence of a group of to-be-encoded data blocks according to a PC-polar encoding method; u with a subscript of "2L" indicates a data block ranked $2L^{th}$; u with a subscript of "2L−1" indicates a data block ranked $(2L-1)^{th}$; u with a subscript of "L+1" indicates a data block ranked $(L+1)^{th}$; u with a subscript of "L" indicates a data block ranked $L^{th}$; and u with a subscript of "L−1" indicates a data block ranked $(L-1)^{th}$; c indicates an encoded data block; c with a subscript of "1" indicates a data block obtained by encoding the data block $u_1$; c with a subscript of "2L" indicates a data block obtained by encoding data blocks $\{u_1, u_2, \ldots, u_{2L-1}, u_{2L}\}$; c with a subscript of "2L−1" indicates a data block obtained by encoding data blocks $\{u_1, u_2, \ldots, u_{2L-1}\}$; c with a subscript of "L+1" indicates a data block obtained by encoding data blocks $\{u_1, u_2, \ldots, u_L, u_{L+1}\}$; c with a subscript of "L" indicates a data block obtained by encoding data blocks $\{u_1, u_2, \ldots, u_{L-1}, u_L\}$; and c with a subscript of "L−1" indicates a data block obtained by encoding data blocks $\{u_1, u_2, \ldots, u_{L-2}, u_{L-1}\}$.

In the embodiment of the data encoding method, the ellipsis " . . . " in $\{u_L \, u_{L-1} \ldots u_1\}$ indicates omission of u with consecutive subscripts between $\dot{u}_{L-1}$ and $u_1$, and when L=2, " . . . " may be ignored because $\dot{u}_{L-1}$ and $u_1$ are the same, and there is no omissible part in the middle.

The ellipsis " . . . " in $\{u_{2L} \, u_{2L-1} \ldots u_{L+1}\}$ indicates omission of u with consecutive subscripts between $\dot{u}_{2L-1}$ and $\dot{u}_{L+1}$, and when L=2, " . . . " may be ignored because $\dot{u}_{2L-1}$ and $\dot{u}_{L+1}$ are the same, and there is no omissible part in the middle.

The ellipsis " . . . " in $\{c_L \, c_{L-1} \ldots c_1\}$ indicates omission of c with consecutive subscripts between $c_{L-1}$ and $c_1$, and when L=2, " . . . " may be ignored because $c_{L-1}$ and $c_1$ are the same, and there is no omissible part in the middle.

The ellipsis " . . . " in $\{c_{2L} \, c_{2L-1} \ldots c_{L+1}\}$ indicates omission of c with consecutive subscripts between $c_{2L-1}$ and $c_{L+1}$, and when L=2, " . . . " may be ignored because $c_{2L-1}$ and $c_{L+1}$ are the same, and there is no omissible part in the middle.

In the embodiment of the data encoding method, the values in the X bits in $\dot{u}_L$ are the same as the values in the X bits in $\dot{u}_{2L}$. It may be considered that the values in the X bits in $\dot{u}_{2L}$ are duplicated from the X bits in $\dot{u}_L$.

In the embodiment of the data encoding method, there are K information bits in $\dot{u}_L$, values in X bits in the K information bits are the same as the values in the X bits in $\dot{u}_{2L}$, $X \leq K$, X is a natural number greater than 0, and information in the X bits in $\dot{u}_L$ is a check frozen bit. For example, values in X bits at positions with lower reliability in $\dot{u}_L$ are the same as the values in the X bits in $\dot{u}_{2L}$, a value of X is at least 1, and a maximum value is a quantity K of all information bits. In this way, in the encoding process, a result of encoding a group of data blocks at a higher aggregation level is different from a result of encoding the group of data blocks at a lower aggregation level, so that there is an encoding gain. In this way, in the embodiment of the data encoding method, when the aggregation level is greater than 1, there may be a full encoding gain caused by an increase in a code length and a decrease in a code rate.

In the embodiment of the data encoding method, English translation of the check frozen bit refers to a parity-check frozen bit or PC-frozen.

The embodiment of the data encoding method may be performed by an eNodeB (English translation: eNodeB), and may be specifically performed by an encoder in the eNodeB. The eNodeB determines, based on a factor such as channel quality, an aggregation level used by a PDCCH (Physical Downlink Control Channel, physical downlink control channel). For example, if the PDCCH is sent to UE (user equipment, user equipment) with very good downlink channel quality (for example, located in the center of a cell), one CCE (Control Channel Element, control channel element) may be sufficient for sending the PDCCH. If the PDCCH is set to UE with very poor downlink channel quality (for example, located on the edge of a cell), eight CCEs may need to be used to send the PDCCH, to achieve sufficient robustness. A higher aggregation level indicates a lower code rate.

Figure 3:
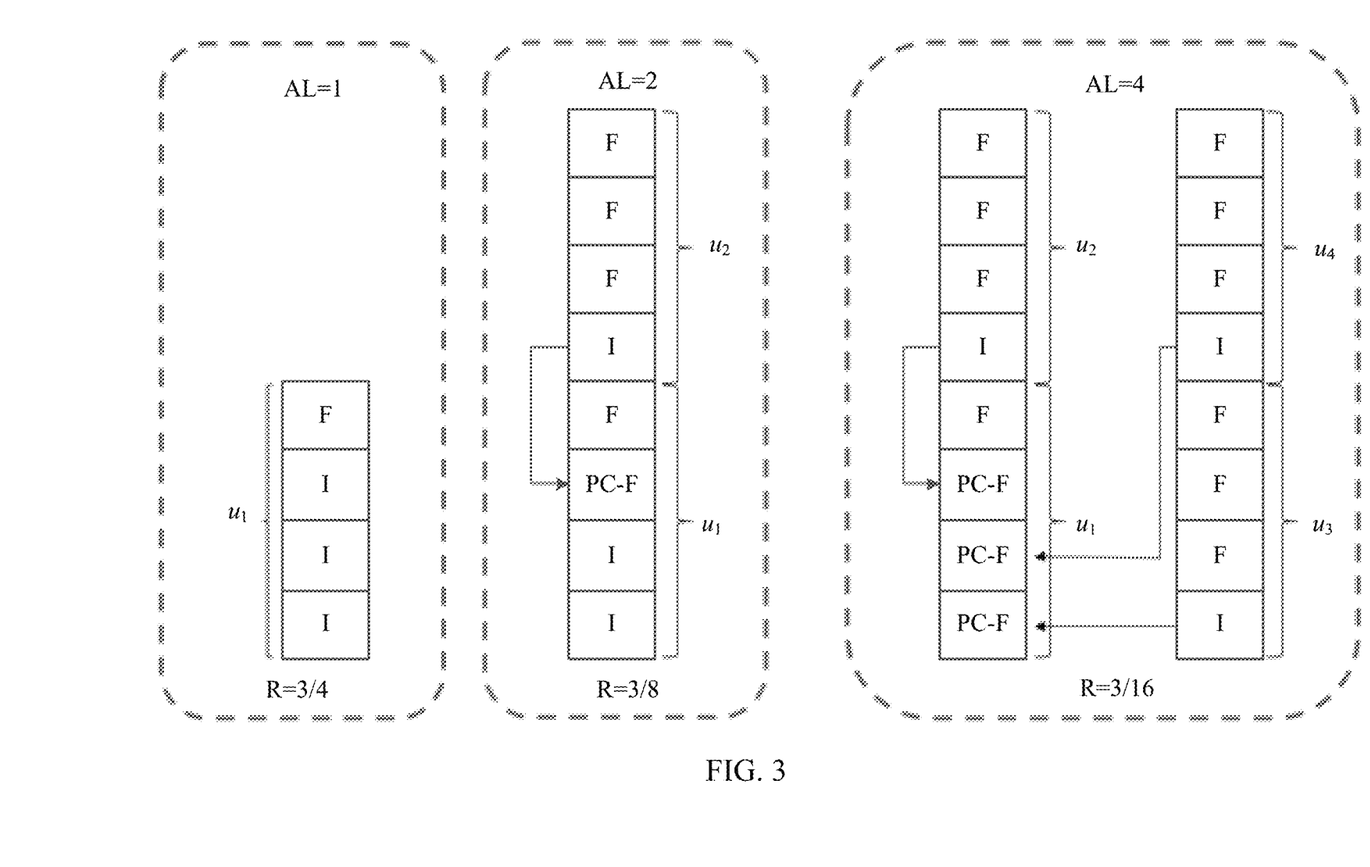
FIG. 3 is a schematic diagram of a specific example of a data encoding method according to an embodiment of the present invention.

As shown in FIG. 3, a specific example is used below to further describe the embodiment of the data encoding method. In the figure, I indicates an information bit before encoding during first data transmission, F indicates a frozen bit, and PC-F indicates a check frozen bit. A bit pointed by a start end of an arrow in the figure has a same value as a bit pointed by a tail end of the arrow.

When the AL=1, where the AL is short for Aggregation Level, and Chinese translation is aggregation level, a mother code length N of the to-be-encoded data block $u_1$ is equal to four bits, and the quantity K of information bits is 3. When the AL=2, a total mother code length of the to-be-encoded data blocks $u_1$ and $u_2$ is 2*N=8 bits, X is 1, the third information bit in $u_1$ is duplicated to a position with highest reliability in $u_2$, a PC-F bit is set at a position of the third information bit in $u_1$, the PC-F bit is used as a check bit, and the PC-F bit has a same value as the duplicated information bit. When the AL=4, a total mother code length of the to-be-encoded data blocks $u_1$, $u_2$, $u_3$, and $u_4$ is 16 bits, X is 2, the first and second information bits in $u_1$ are respectively duplicated to positions with highest reliability in $u_3$ and $u_4$, and PC-F bits are set at positions of the first and second information bits in $u_1$.

Figure 4:
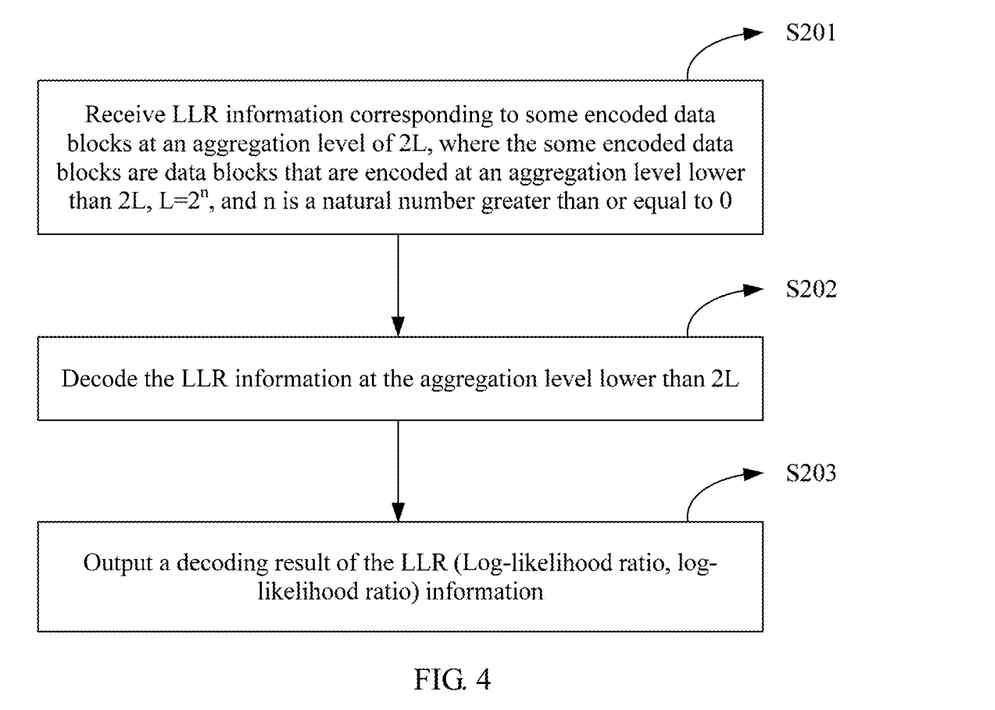
FIG. 4 is a schematic diagram of a data decoding method according to an embodiment of the present invention.

As shown in FIG. 4, an embodiment of the present invention further provides a data decoding method, including the following steps:

S201. Receive LLR information corresponding to some encoded data blocks at an aggregation level of 2L, where the some encoded data blocks are data blocks that are encoded at an aggregation level lower than 2L, L=2n, and n is a natural number greater than or equal to 0.

S202. Decode the LLR information at the aggregation level lower than 2L.

S203. Output a decoding result of the LLR (Log-likelihood ratio, log-likelihood ratio) information.

In the embodiment of the data decoding method, K information bits are also carried; when encoding is performed at different aggregation levels, a receive end (for example, a terminal) performs decoding at a lower aggregation level first, and when the decoding succeeds at the lower aggregation level, does not need to read an LLR at a higher aggregation level for decoding, thereby effectively reducing a decoding delay and stopping the decoding early.

If the decoding fails, an LLR at a higher aggregation level is further read for decoding.

In the embodiment of the data decoding method, a data block that is encoded at the aggregation level of 2L is nested with a data block that is encoded at the aggregation level lower than 2L. It should be noted that, the encoded data block is obtained through encoding. In an encoding process, the encoding may be performed at the aggregation level of 2L, or the encoding may be performed at the aggregation level lower than 2L, and a value of the aggregation level used for the encoding is a power of 2. In the embodiment of the data decoding method, a receive end does not know an aggregation level at which the encoded data block corresponding to the received LLR information is encoded. Therefore, this is a blind detection process. Decoding starts when a set of LLR information is received, and encoded data blocks corresponding to the set of LLR information may be only some of a group of encoded data blocks sent by a transmit end. For example, the encoded data blocks corresponding to the received set of LLR information are encoded at an aggregation level of L, and the group of encoded data blocks sent by the transmit end are encoded at the aggregation level of 2L.

The receive end does not know an aggregation level at which the transmit end performs encoding, and therefore, may attempt to perform decoding from a low aggregation level, for example, attempt to perform decoding at an aggregation level of 1 first, and then perform decoding at an aggregation level of 2. An attempted aggregation level is constantly increasing. Certainly, the receive end may also attempt to perform decoding at the aggregation level of 2 first.

In the embodiment of the data decoding method, when an encoder side uses the aggregation level of 2L in an encoding process, the receive end may perform decoding when receiving LLR information corresponding to a data block that is encoded at the aggregation level lower than 2L, and if decoding the LLR information succeeds, outputs a decoding result. The decoding result includes: a state of the data block before encoding of the data block that is encoded at the aggregation level lower than 2L, namely, an original data block before the data block is encoded at the aggregation level lower than 2L, and may further include an information bit carried in the decoded data block. In this way, remaining LLR information is not required for decoding. Based on the data decoding method in this embodiment of the present invention, even if the data block is encoded at the aggregation level of 2L, decoding may succeed at an aggregation level of L or even lower. In this way, in a decoding process, it is unnecessary to traverse all possible aggregation levels for detection. Therefore, a quantity of blind detection is effectively reduced.

In the embodiment of the data decoding method, the encoded data block at the aggregation level of 2L is obtained by encoding a data block at the aggregation level of 2L.

In the embodiment of the data decoding method, the data block that is encoded at the aggregation level lower than 2L is obtained by encoding a data block at the aggregation level lower than 2L.

In the embodiment of the data decoding method, the LLR information corresponding to the encoded data block is obtained from the encoded data block. For example, the LLR information is obtained through processes of modulating the encoded data block and transmitting the encoded data block through a channel.

In the embodiment of the data decoding method, the decoding the LLR information at the aggregation level lower than 2L includes:

decoding the LLR information corresponding to the data block that is encoded at the aggregation level lower than 2L.

The embodiment of the data decoding method is implemented to obtain through decoding a data block before the data block is encoded in the embodiment of the data encoding method. Therefore, the formulas, meanings, and values of various parameters in the formulas, and specific implementations of the data decoding method and the data encoding method mutually correspond, and can be mutually referenced. In the embodiment of the data decoding method in the present invention, an LLR corresponding to a lower aggregation level of $\dot{c}_L$ is first received for decoding. When the LLR corresponding to the lower aggregation level of $\dot{c}_L$ is decoded successfully, it is not necessary to continue to decode an LLR corresponding to $\dot{c}_{2L}$.

In the embodiment of the data decoding method, the decoding result includes decoded $\dot{u}_L$ and $\dot{u}_{2L}$, $\dot{u}_L = \{u_L\ u_{L-1}\ \ldots\ u_1\}$, $\dot{u}_{2L} = \{u_{2L}\ u_{2L-1}\ \ldots\ u_{L+1}\}$, u with a subscript indicates a to-be-encoded data block, the subscript of u indicates an order in which the to-be-encoded data block is arranged based on a polar construction sequence, values in X bits in $\dot{u}_L$ are the same as values in X bits in $\dot{u}_{2L}$, information in at least one bit in $\dot{u}_{2L}$ except the X bits is a frozen bit and/or a check frozen bit, and X is a natural number greater than 0.

In the embodiment of the data decoding method, there are a total of K information bits in $\dot{u}_L$ and $\dot{u}_{2L}$, K is a natural number greater than 0, $X \leq K < N$, and N indicates a length of an encoded mother code when $L=1$.

In the embodiment of the data decoding method, information in the X bits in $\dot{u}_L$ is a check frozen bit.

Check frozen bits in the X bits in are in a one-to-one corresponding check relationship with information bits in the X bits. For example, it may be understood that, each check frozen bit in the X bits in corresponds to one information bit in the X bits in, and the two bits may be checked according to a check equation.

The embodiment of the data decoding method may be performed by UE (user equipment, user equipment), for example, performed by a terminal, and may be specifically performed by a decoder in the UE. It can be learned from the embodiment of the data decoding method that, in the decoding process, the decoding may be performed at a lower aggregation level first, to be specific, an LLR corresponding to the lower aggregation level is received for decoding, and if decoding the LLR succeeds, it is unnecessary to read an LLR (Log-likelihood ratio, log-likelihood ratio) at a higher aggregation level, thereby reducing a decoding delay and stopping the decoding early. When the terminal is not clear about a current aggregation level and can perform only blind detection, the terminal may perform decoding at a lower aggregation level first, and if the decoding succeeds, does not need to perform decoding at a higher aggregation level. Therefore, the embodiment of the data decoding method is applicable to a process in which a decoder side performs blind detection in a search space.

A specific example is used below to further describe the data decoding method.

When encoding a group of data blocks at the aggregation level of 2, the transmit end obtains encoded $c_1$ and $c_2$, and sends $c_1$ and $c_2$ to the receive end. After receiving an LLR 1 corresponding to $c_1$, the receive end can decode the LLR 1 to obtain $u_1$. If a channel status becomes better, a probability of successful decoding is higher. All information bits carried in $u_2$ and information bits carried in $u_1$ are repeated. Therefore, if the information bits carried in $u_1$ are obtained, all the information bits carried in $u_1$ and $u_2$ are obtained.

Although a PC-F bit in $u_1$ may be used for check after $c_1$ and $c_2$ are received and $u_1$ and $u_2$ are obtained through decoding, when only the LLR 1 corresponding to $c_1$ is received, in a process of decoding the LLR 1, based on a check relationship, a value of at least one PC-F bit in $u_1$ is respectively equal to a value of at least one information bit I in $u_2$, and all the information bits can be obtained by directly decoding the LLR 1.

Another specific example is used below to further describe the data decoding method.

Step 1: An eNodeB delivers, to a terminal, an encoded data block at an aggregation level of 4. The terminal first receives an LLR (Log-likelihood ratio, a log-likelihood ratio) 1 corresponding to the encoded data block $c_1$, where the LLR 1 is obtained through processes of modulating the encoded data block $c_1$, transmitting the encoded data block $c_1$ through a channel, and the like, decodes the LLR 1 corresponding to the encoded data to obtain $u_1$, and if decoding the LLR 1 succeeds, outputs an information bit carried in $u_1$.

If decoding the LLR 1 fails, go to step 2.

Step 2: If decoding $u_1$ fails in step 1, the terminal continues to receive an LLR 2 corresponding to data, where the LLR 2 corresponds to an encoded data block $c_2$, and the LLR 2 is obtained through processes of modulating the encoded data block $c_2$, transmitting the encoded data block $c_2$ through a channel, and the like. In this way, the terminal receives both the LLR 1 and the LLR 2 corresponding to the encoded data, then decodes the LLR 1 and the LLR 2 corresponding to the encoded data, and if decoding the LLR 1 and the LLR 2 succeeds, outputs information bits carried in $u_1$ and $u_2$.

As shown in the figure, when the aggregation level is 2, both the LLR 2 and the LLR 1 enter the decoder, to obtain the information bits in $u_2$ and $u_1$. In addition, because sequential decoding is performed in the decoding process, $u_2$ is obtained through decoding first. After $u_2$ is obtained, an information bit I in $u_2$ is obtained. A value of the information bit I in $u_2$ is the same as a value of a PC-F bit in $u_1$. The information bit I in $u_2$ may be used to check the PC-F bit in $u_1$. Based on the check relationship, the PC-F bit may be forcibly set to I.

If decoding $c_1$ and $c_2$ fails, go to step 3.

The check relationship herein relates to a step of forming a check equation in an entire PC-polar encoding process. For a PC polar code, before polar encoding is performed, check precoding is first performed on an information bit. A precoding process is briefly described as follows: The last one of members of the check equation is a check bit. A value of the check bit is addition modulo 2 of other members of the check equation. For example, if the check equation is [1 3 5 7], the subchannels 1, 3 and 5 are information subchannels. If values of the subchannels are respectively m1, m3, and m5, the value of the check bit is m7=mod(m1+m3+m5, 2).

Therefore, a check function of the check frozen bit herein is to satisfy the check relationship with the foregoing information bits. For example, when the information bit m1 at the aggregation level of 1 is duplicated into the information bit m2 at the aggregation level of 2, and m1 becomes a check frozen bit, in the decoding process at the aggregation level of 2, m2 is decoded first, and it is equivalent to decoding of m1. Because m1 is used as a check bit of m2, there is a relationship: m1=m2. This relationship between m1 and m2 is used by the check equation to achieve a check function.

Step 3: If decoding the LLR 1 and the LLR 2 fails in step 2, the terminal continues to receive an LLR 3 and an LLR 4 corresponding to data. The LLR 3 corresponds to an encoded data block $c_3$, and the LLR 3 is obtained through processes of modulating the encoded data block $c_3$, transmitting the encoded data block $c_3$ through a channel, and the like. The LLR 4 corresponds to an encoded data block $c_4$, and the LLR 4 is obtained through processes of modulating the encoded data block $c_4$, transmitting the encoded data block $c_4$ through a channel, and the like. In this way, the terminal receives all of the LLR 1, the LLR 2, the LLR 3, and the LLR 4 corresponding to the encoded data, and decodes the LLR 1, the LLR 2, the LLR 3, and the LLR 4 corresponding to the encoded data.

As shown in the figure, when the aggregation level is 4, {LLR 4, LLR 3, LLR 2, LLR 1} sequentially enter the decoder. The LLR 4 is decoded first to obtain $u_4$, the LLR 3 is decoded to obtain $u_3$, the LLR 2 is then decoded to obtain $u_2$, and the LLR 1 is decoded to obtain $u_1$. After $u_4$, $u_3$, and $u_2$ are obtained through decoding, information bits I in $u_4$, $u_3$, and $u_2$ are obtained. A value of the information bit I in $u_4$ is the same as a value of one PC-F bit in $u_1$, a value of the information bit I in $u_3$ is the same as a value of one PC-F bit in $u_1$, and a value of the information bit I in $u_2$ is the same as a value of one PC-F bit in $u_1$. The information bits I in $u_4$, $u_3$, and $u_2$ may be used to check the PC-F bits in $u_1$. Based on the check relationship, the PC-F bit in $u_1$ may be forcibly set to I.

If the aggregation level indicated by the eNodeB is 4, the terminal receives the LLR 3 and the LLR 4 by step 4, and if decoding the LLR 3 and the LLR 4 succeeds, may output the information bits carried in the LLR 1, the LLR 2, the LLR 3, and the LLR 4.

It may be learned from the foregoing specific example of the data decoding method that, the terminal may perform decoding at a lower aggregation level first, and if the decoding succeeds, does not need to perform decoding at a higher aggregation level, thereby reducing a decoding delay and stopping the decoding early.

Figure 5:
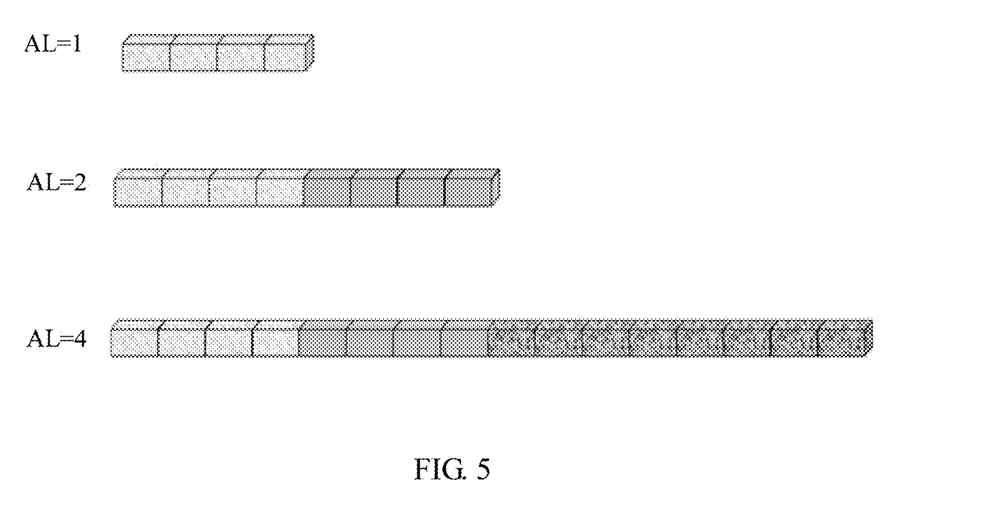
FIG. 5 is a schematic diagram of a specific example of a data decoding method according to an embodiment of the present invention.

As shown in FIG. 5, an example of a search space is provided below when the aggregation level of 4 is used in the embodiment of the data decoding method. In FIG. 5, to clearly describe the concept that a data block that is encoded at a lower aggregation level is a part of a data block that is encoded at a higher aggregation level, a case in which the AL=1, a case in which the AL=2, and a case in which the AL=4 are shown in one drawing. Assuming that the aggregation level delivered by the encoder side (for example, the eNodeB) is 4, when performing blind detection for searching, the receive end (for example, a user end or a terminal device) performs blind detection at the aggregation level of 1, and also performs blind detection at the aggregation level of 2. In existing LTE (Long Term Evolution, Long Term Evolution), if an aggregation level at which a user performs blind detection does not match the aggregation level delivered by the encoder side (for example, the eNodeB), decoding cannot succeed, because there is no nested relationship between an existing data block to be encoded at a higher aggregation level and a data block to be encoded at a lower aggregation level.

In FIG. 5, it may be clearly seen that, in the data encoding method and the data decoding method in the embodiments of the present invention, there is a nested relationship between a data block to be encoded at a higher aggregation level and a data block to be encoded at a lower aggregation level. For example, the data block to be encoded at the aggregation level of 2 includes the data block to be encoded at the aggregation level of 1, and the data block to be encoded at the aggregation level of 4 includes the data block to be encoded at the aggregation level of 2. Data blocks filled with a same color in the figure are the same.

Therefore, when the receive end (for example, a user end or a terminal device) decodes some received LLR data at a low aggregation level, there is a possibility of successful decoding. If the decoding succeeds, a decoding delay can be significantly reduced.

FIG. 5 is a schematic diagram only showing a search space when the aggregation level is 4. The data encoding method and the data decoding method in the embodiments of the present invention are also applicable to a higher aggregation level.

Figure 6:
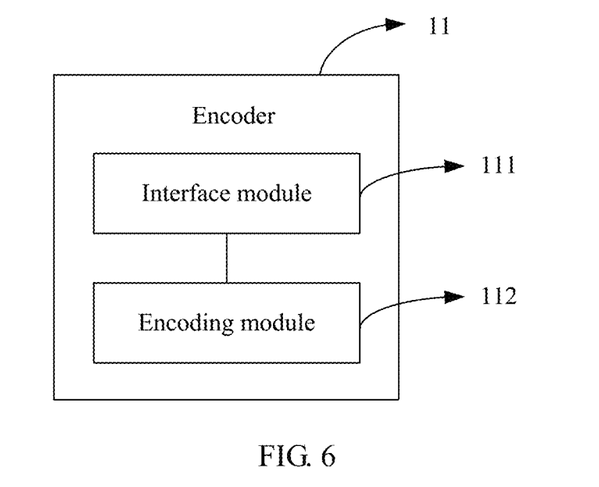
FIG. 6 is a schematic structural diagram of Embodiment 1 of an encoder according to the present invention.

FIG. 6 is a schematic structural diagram of Embodiment 1 of an encoder according to the present invention. As shown in FIG. 6, Embodiment 1 of an encoder 11 in this embodiment includes an interface module 111 and an encoding module 112. The interface module 111 is configured to receive a to-be-encoded data block.

The encoding module 112 is configured to encode the data block at an aggregation level of 2L, where a formula used during the encoding is as follows:

$$[\dot{u}_{2L} \ \dot{u}_L] \begin{bmatrix} G_{LN} & 0 \\ G_{LN} & G_{LN} \end{bmatrix} = [\dot{c}_{2L} \ \dot{c}_L],$$

where $\dot{u}_L = \{u_L \ u_{L-1} \ \ldots \ u_1\}$, $\dot{u}_{2L} = \{u_{2L} \ u_{2L-1} \ \ldots \ u_{L+1}\}$, $\dot{c}_L = \{c_L \ c_{L-1} \ \ldots \ c_1\}$, $\dot{c}_{2L} = \{c_{2L} \ c_{2L-1} \ \ldots \ c_{L+1}\}$, $G_{LN} = G_N^{\otimes \log_2}$, $L=2^n$, n is a natural number greater than or equal to 0, $G_N$ is a coding matrix of a polar code having a length of N, u with a subscript indicates the to-be-encoded data block, the subscript of u indicates an order in which the to-be-encoded data block is arranged based on a polar construction sequence, and c with a subscript indicates an encoded data block.

The interface module 111 is further configured to output the encoded data block.

The encoder 11 provided in this embodiment of the present invention may be configured to perform various embodiments of the data encoding method, and implementation principles and technical effects of the encoder and the data encoding method are similar. Details are not described herein again. Specifically, various specific implementations related to S101 and S103 in the data encoding method may also be correspondingly used as various specific implementations of functions of the interface module 111 in the encoder 11. Various specific implementations related to S102 in the data encoding method may also be correspondingly used as various specific implementations of functions of the encoding module 112 in Embodiment 1 of the encoder 11.

Figure 7:
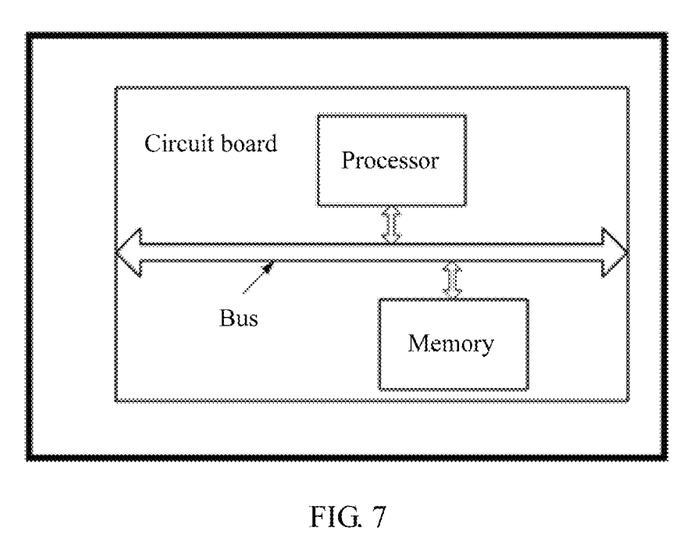
FIG. 7 is a schematic structural diagram of Embodiment 2 of an encoder, Embodiment 3 of an encoder, Embodiment 2 of a decoder, and Embodiment 3 of a decoder according to the present invention.

FIG. 7 is a schematic structural diagram of Embodiment 2 of an encoder according to the present invention. As shown in FIG. 7, Embodiment 2 of the encoder in this embodiment includes at least one circuit board, and a processor, a memory, and a bus that are disposed on the at least one circuit board. The processor is connected to the memory by using the bus, and when the encoder is operating, the processor reads and executes an instruction in the memory or runs a hardware logical circuit of the processor, so that the encoder performs various embodiments of the data encoding method.

In Embodiment 2 of the encoder, the memory and the processor may be located in a same circuit board, or the memory and the processor may be located in different circuit boards.

FIG. 7 is also a schematic structural diagram of Embodiment 3 of an encoder according to the present invention. Embodiment 3 of the encoder in this embodiment includes at least one circuit board, and a processor, a memory, and a bus that are disposed on the at least one circuit board. The processor is connected to the memory by using the bus, and when Embodiment 3 of the encoder is operating, the processor reads and executes an instruction in the memory or runs a hardware logical circuit of the processor, so that Embodiment 3 of the encoder implements functions in various implementations of the interface module 111 and the encoding module 112 in Embodiment 1 of the encoder 11.

In Embodiment 3 of the encoder, the memory and the processor may be located in a same circuit board, or the memory and the processor may be located in different circuit boards.

Figure 8:
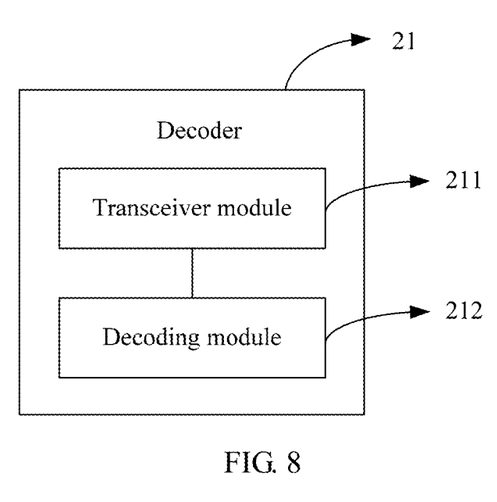
FIG. 8 is a schematic structural diagram of Embodiment 1 of a decoder according to the present invention.

FIG. 8 is a schematic structural diagram of Embodiment 1 of a decoder according to the present invention. As shown in FIG. 8, Embodiment 1 of a decoder 21 in this embodiment includes a transceiver module 211 and a decoding module 212. The transceiver module 211 is configured to receive LLR information corresponding to some encoded data blocks at an aggregation level of 2L, where the some encoded data blocks are data blocks that are encoded at an aggregation level lower than 2L, $L=2^n$, and n is a natural number greater than or equal to 0.

The decoding module 212 is configured to decode the LLR information at the aggregation level lower than 2L.

The transceiver module 211 is further configured to output a decoding result of the LLR (Log-likelihood ratio, log-likelihood ratio) information.

The decoder 21 provided in this embodiment of the present invention may be configured to perform various embodiments of the data decoding method, and implementation principles and technical effects of the decoder and the data decoding method are similar. Details are not described herein again. Specifically, various specific implementations related to S201 and S203 in the data decoding method may also be correspondingly used as various specific implementations of functions of the transceiver module 211 in Embodiment 1 of the decoder 21. Various specific implementations related to S202 in the data decoding method may also be correspondingly used as various specific implementations of functions of the decoding module 212 in Embodiment 1 of the decoder 21.

FIG. 7 may also be used as a schematic structural diagram of Embodiment 2 of a decoder according to the present invention. As shown in FIG. 7, Embodiment 2 of the decoder in this embodiment includes at least one circuit board, and a processor, a memory, and a bus that are disposed on the at least one circuit board. The processor is connected to the memory by using the bus, and when Embodiment 2 of the decoder is operating, the processor reads and executes an instruction in the memory or runs a hardware logical circuit of the processor, so that the encoder performs various embodiments of the data decoding method.

In Embodiment 2 of the decoder, the memory and the processor may be located in a same circuit board, or the memory and the processor may be located in different circuit boards.

FIG. 7 may also be used as a schematic structural diagram of Embodiment 3 of a decoder according to the present invention. As shown in FIG. 7, Embodiment 3 of the decoder in this embodiment includes at least one circuit board, and a processor, a memory, and a bus that are disposed on the at least one circuit board. The processor is connected to the memory by using the bus, and when Embodiment 3 of the decoder is operating, the processor reads and executes an instruction in the memory or runs a hardware logical circuit of the processor, so that Embodiment 3 of the decoder 23 implements various implementations of functions of the transceiver module 211 and the decoding module 212 in Embodiment 1 of the decoder 21.

In Embodiment 3 of the decoder, the memory and the processor may be located in a same circuit board, or the memory and the processor may be located in different circuit boards.

In the foregoing embodiments of the encoder and the decoder, the processor may be an integrated circuit that works according to a non-fixed instruction or an integrated circuit that works according to a fixed instruction. The processor that works according to a non-fixed instruction reads and executes the instruction in the memory to implement various embodiments of the data encoding method and the data decoding method, or implement various implementations of the functions of the interface module 111 and the encoding module 112 in Embodiment 1 of the encoder 11, or implement various implementations of the functions of the transceiver module 211 and the decoding module 212 in Embodiment 1 of the decoder 21. The processor that works according to a fixed instruction runs the hardware logical circuit of the processor to implement various embodiments of the data encoding method and the data decoding method, or implement various implementations of the functions of the interface module 111 and the encoding module 112 in Embodiment 1 of the encoder 11, or implement various implementations of the functions of the transceiver module 211 and the decoding module 212 in Embodiment 1 of the decoder 21. In a process in which the processor that works according to a fixed instruction runs the hardware logical circuit of the processor, the processor often needs to read some data from the memory, or output a running result to the memory. The memory is a storage medium that can be conveniently read by the processor, such as a random access memory (Random Access Memory, RAM for short), a flash memory, a read-only memory (Read-Only Memory, ROM for short), a programmable read-only memory, an electrically erasable programmable memory, a cache (CACHE), or a register.

In various embodiments of the foregoing encoder, decoder, and data processing apparatus, the processor may be a central processing unit (Central Processing Unit, CPU for short) and a graphics processing unit (Graphics Processing Unit, GPU for short), a digital signal processor (Digital Signal Processor, DSP for short), and an application-specific integrated circuit (Application-Specific Integrated Circuit, ASIC for short), a field programmable gate array (Field Programmable Gate Array, FPGA for short), a network processor (Network Processor, NP for short), another programmable logic device, a discrete gate transistor logic device, or a discrete hardware component, and the like.

All or some of the foregoing embodiments may be implemented by software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedure or functions according to the embodiments of the present invention are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, and microwave, or the like) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a Solid State Disk (SSD)), or the like.

In addition, the term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

The invention claimed is:

1. A data encoding method, wherein the method comprises:
receiving a to-be-encoded data block in a communication system;
encoding the to-be-encoded data block at an aggregation level of 2L according to a formula as follows:

$$[\dot{u}_{2L} \ \dot{u}_L] \begin{bmatrix} G_{LN} & 0 \\ G_{LN} & G_{LN} \end{bmatrix} = [\dot{c}_{2L} \ \dot{c}_L],$$

where $\dot{u}_L = \{u_L \ u_{L-1} \ \ldots \ u_1\}$, $\dot{u}_{2L} = \{u_{2L} \ u_{2L-1} \ \ldots \ u_{L+1}\}$, $\dot{c}_L = \{c_L \ c_{L-1} \ \ldots \ c_1\}$, $\dot{c}_{2L} = \{c_{2L} \ c_{2L-1} \ \ldots \ c_{L+1}\}$, $G_{LN} = G_N^{\otimes \log_2(L)}$, $L = 2^n$, n is a natural number greater than or equal to 0, $G_N$ is a coding matrix of a polar code having a length of N, u with a subscript indicates the to-be-encoded data block, the subscript of u indicates an order in which the to-be-encoded data block is arranged based on a polar construction sequence, and c with a subscript indicates an encoded data block; and
outputting the encoded data block, wherein the encoded data block is modulated and transmitted over a communication channel in the communications system.

2. The method according to claim 1, wherein values in X bits in $\dot{u}_L$ are the same as values in X bits in $\dot{u}_{2L}$, information in at least one bit in $\dot{u}_{2L}$ except the X bits in $\dot{u}_{2L}$ is a frozen bit and/or a check frozen bit, and X is a natural number greater than 0.

3. The method according to claim 2, wherein polarization channel reliability at positions of the X bits in $\dot{u}_{2L}$ is higher than or equal to reliability at positions of the X bits in $\dot{u}_L$, and the polarization channel reliability is a polarization weight of each polarization channel.

4. The method according to claim 2, wherein a value in at least one bit in at least one of data blocks u with subscripts greater than 1 is the same as a value in at least one bit storing a check frozen bit in a data block $u_1$.

5. The method according to claim 2, wherein there are a total of K information bits in $\dot{u}_L$ and $\dot{u}_{2L}$, K is a natural number greater than 0, X≤K<N, and N indicates a length of an encoded mother code when L=1.

6. The method according to claim 2, wherein information in the X bits in $\dot{u}_L$ is a check frozen bit.

7. The method according to claim 1, wherein information in all bits in $\dot{u}_{2L}$ except X bits is a frozen bit and/or a check frozen bit.

8. A data decoding method, wherein the method comprises: receiving a modulated signal transmitted over a communication channel in a communications system, wherein the modulated signal comprises one or more encoded data blocks at an aggregation level of 2L, L=$2^n$, and n is a natural number greater than or equal to 0, wherein the one or more encoded data blocks comprise at least one data block that is encoded at an aggregation level lower than 2L;
obtaining log-likelihood ratio (LLR) information based on the modulated signal;
decoding the LLR information at the aggregation level lower than 2L;
in response to determining that the decoding at the aggregation level lower than 2L is successful, refraining from decoding the LLR information at the aggregation level of 2L; or
in response to determining that the decoding at the aggregation level lower than 2L is not successful, decoding the LLR information at the aggregation level of 2L; and
outputting a decoding result of the LLR information in the communications system.

9. The method according to claim 8, wherein the one or more encoded data blocks at the aggregation level of 2L are obtained by encoding one or more to-be-encoded data blocks at the aggregation level of 2L.

10. The method according to claim 8, wherein the at least one data block that is encoded at the aggregation level lower than 2L is obtained by encoding at least a to-be-encoded data block at the aggregation level lower than 2L.

11. The method according to claim 8, wherein the decoding result comprises decoded $\dot{u}_L$ and $\dot{u}_{2L}$, $\dot{u}_L = \{u_L \ u_{L-1} \ldots u_1\}$, $\dot{u}_{2L} = \{u_{2L} \ u_{2L-1} \ldots u_{L+1}\}$, u with a subscript indicates a to-be-encoded data block, the subscript of u indicates an order in which the to-be-encoded data block is arranged based on a polar construction sequence, values in X bits in $\dot{u}_L$ are the same as values in X bits in $\dot{u}_{2L}$, information in at least one bit in $\dot{u}_{2L}$ except the X bits is a frozen bit and/or a check frozen bit, and X is a natural number greater than 0.

12. The method according to claim 11, wherein there are a total of K information bits in $\dot{u}_L$ and $\dot{u}_{2L}$, K is a natural number greater than 0, X≤K<N, and N indicates a length of an encoded mother code when L=1.

13. The method according to claim 11 wherein information in the X bits in $\dot{u}_L$ is a check frozen bit.

14. An apparatus, wherein the apparatus comprises an interface and an encoding, the interface is configured to receive a to-be-encoded data block in a communications system;
the encoding is configured to encode the to-be-encoded data block at an aggregation level of 2L, according to a formula as follows:

$$[\dot{u}_{2L} \ \dot{u}_L]\begin{bmatrix} G_{LN} & 0 \\ G_{LN} & G_{LN} \end{bmatrix} = [\dot{c}_{2L} \ \dot{c}_L],$$

where $\dot{u}_L = \{u_L \ u_{L-1} \ldots u_1\}$, $\dot{u}_{2L} = \{u_{2L} \ u_{2L-1} \ldots u_{L+1}\}$, $\dot{c}_L = \{c_L \ c_{L-1} \ldots c_1\}$, $\dot{c}_{2L} = \{c_{2L} \ c_{2L-1} \ldots c_{L+1}\}$, $G_{LN} = G_N^{\otimes \log_2(L)}$, L=$2^n$, n is a natural number greater than or equal to 0, $G_N$ is a coding matrix of a polar code having a length of N, u with a subscript indicates the to-be-encoded data block, the subscript of u indicates an order in which the to-be-encoded data block is arranged based on a polar construction sequence, and c with a subscript indicates an encoded data block; and
the interface is further configured to output the encoded data block, wherein the encoded data block is modulated and transmitted over a communication channel in the communications system.

15. The apparatus according to claim 14, wherein in the formula used by the encoding module, values in X bits in $\dot{u}_L$ are the same as values in X bits in $\dot{u}_{2L}$, information in at least one bit in $\dot{u}_{2L}$ except the X bits is a frozen bit, a check frozen bit, or both, and X is a natural number greater than 0.

16. The apparatus according to claim 15, wherein in the formula used by the encoding module, information in all bits in $\dot{u}_{2L}$ except the X bits is a frozen bit, a check frozen bit, or both.

17. The apparatus according to claim 15, wherein in the formula used by the encoding module, polarization channel reliability at positions of the X bits in $\dot{u}_{2L}$ is higher than or equal to reliability at positions of the X bits in $\dot{u}_L$, and the polarization channel reliability is a polarization weight of each polarization channel.

18. The apparatus according to claim 15, wherein in the formula used by the encoding module, there are a total of K information bits in $\dot{u}_L$ and $\dot{u}_{2L}$, K is a natural number greater than 0, X≤K<N, and N indicates a length of an encoded mother code when L=1.

19. The apparatus according to claim 15, wherein in the formula used by the encoding module, information in the X bits in $\dot{u}_L$ is a check frozen bit.

20. The apparatus according to claim 14, wherein in the formula used by the encoding module, a value in at least one bit in at least one of data blocks u with subscripts greater than 1 is the same as a value in at least one bit storing a check frozen bit in a data block $u_1$.

21. An apparatus, comprising: at least one processor and a memory storing program instructions for execution by the at least one processor; wherein when executed by the at least one processor, the program instructions cause the apparatus to:
receive a to-be-encoded data block in a communications system; and
encode the to-be-encoded data block at an aggregation level of 2L according to a formula as follows:

$$[\dot{u}_{2L} \ \dot{u}_L]\begin{bmatrix} G_{LN} & 0 \\ G_{LN} & G_{LN} \end{bmatrix} = [\dot{c}_{2L} \ \dot{c}_L],$$

where $\dot{u}_L = \{u_L \ u_{L-1} \ldots u_1\}$, $\dot{u}_{2L} = \{u_{2L} \ u_{2L-1} \ldots u_{L+1}\}$, $\dot{c}_L = \{c_L \ c_{L-1} \ldots c_1\}$, $\dot{c}_{2L} = \{c_{2L} \ c_{2L-1} \ldots c_{L+1}\}$, $G_{LN} =$ $G_N^{\otimes log_2(L)}$, $L=2^n$, n is a natural number greater than or equal to 0, $G_N$ is a coding matrix of a polar code having a length of N, u with a subscript indicates the to-be-encoded data block, the subscript of u indicates an order in which the to-be-encoded data block is arranged based on a polar construction sequence, and c with a subscript indicates an encoded data block, wherein the encoded data block is modulated and transmitted over a communication channel in the communications system.

22. An apparatus, comprising:
an interface circuit; and
a logic circuit,
wherein the interface circuit is configured to receive a to-be-encoded data block in a communications system;
wherein the logic circuit is configured to encode the to-be-encoded data block at an aggregation level of 2L according to a formula as follows:

$$[\dot{u}_{2L}\ \dot{u}_L] \begin{bmatrix} G_{LN} & 0 \\ G_{LN} & G_{LN} \end{bmatrix} = [\dot{c}_{2L}\ \dot{c}_L],$$

where $\dot{u}_L = \{u_L\ u_{L\ 1} \ldots u_1\}$, $\dot{u}_{2L} = \{u_{2L}\ u_{2L\ 1} \ldots u_{L|1}\}$, $\dot{c}_L = \{c_L\ c_{L\ 1} \ldots c_1\}$, $\dot{c}_{2L} = \{c_{2L}\ c_{2L\ 1} \ldots c_{L|1}\}$, $G_{LN} = G_N^{\otimes log_2(L)}$, $L=2^n$, n is a natural number greater than or equal to 0, $G_N$ is a coding matrix of a polar code having a length of N, u with a subscript indicates the to-be-encoded data block, the subscript of u indicates an order in which the to-be-encoded data block is arranged based on a polar construction sequence, and c with a subscript indicates an encoded data block, wherein the encoded data block is modulated and transmitted over a communication channel in the communications system.

23. An apparatus, wherein the apparatus comprises a transceiver and a decoder, wherein:
the transceiver is configured to receive a modulated signal transmitted over a communication channel in a communications system, wherein the modulated signal comprises one or more encoded data blocks at an aggregation level of 2L, L=2n, and n is a natural number greater than or equal to 0, wherein the one or more encoded data blocks comprise at least one data block that is encoded at an aggregation level lower than 2L;
the decoder is configured to:
obtain LLR information based on the modulated signal;
decode the LLR information at the aggregation level lower than 2L;
in response to determining that the LLR information is successfully decoded at the aggregation level lower than 2L, refrain from decoding the LLR information at the aggregation level of 2L; or
in response to determining that the LLR information is not successfully decoded at the aggregation level lower than 2L, decode the LLR information at the aggregation level of 2L; and
the transceiver is further configured to output a decoding result of the LLR information in the communications system.

24. An apparatus, comprising: at least one processor and a memory storing program instructions for execution by the at least one processor; wherein when executed by the at least one processor, the program instructions cause the apparatus to:
receive a modulated signal transmitted over a communication channel in a communications system, wherein the modulated signal comprises one or more encoded data blocks at an aggregation level of 2L, L=2n, and n is a natural number greater than or equal to 0, wherein the one or more encoded data blocks comprise at least one data block that is encoded at an aggregation level lower than 2L;
obtain LLR information based on the modulated signal;
decode the LLR information at the aggregation level lower than 2L; and
in response to determining that the LLR information is successful decoded at the aggregation level lower than 2L, refrain from decoding the LLR information at the aggregation level of 2L; or in response to determining that the LLR information is not successfully decoded at the aggregation level lower than 2L, decode the LLR information at the aggregation level of 2L,
wherein a decoding result of the LLR information is output in the communications system.

25. An apparatus, comprising:
an interface circuit; and
a logic circuit,
wherein the interface circuit, configured to receive a modulated signal transmitted over a communication channel in a communications system, wherein the modulated signal comprises one or more encoded data blocks at an aggregation level of 2L, $L=2^n$ and n is a natural number greater than or equal to 0, wherein the one or more encoded data blocks comprise at least one data block that is encoded at an aggregation level lower than 2L; and
wherein the logic circuit is configured to:
obtain LLR information based on the modulated signal;
decode the LLR information at the aggregation level lower than 2L; and
in response to determining that the LLR information is successfully decoded at the aggregation level lower than 2L, refrain from decoding the LLR information at the aggregation level of 2L; or
in response to determining that the LLR information is not successfully decoded at the aggregation level lower than 2L, decode the LLR information at the aggregation level of 2L, wherein a decoding result of the LLR information is output in the communications system.

* * * * *

UNITED STATES PATENT AND TRADEMARK OFFICE
CERTIFICATE OF CORRECTION

PATENT NO. : 11,362,676 B2
APPLICATION NO. : 16/505200
DATED : June 14, 2022
INVENTOR(S) : Guijie Wang et al.

It is certified that error appears in the above-identified patent and that said Letters Patent is hereby corrected as shown below:

In the Claims

In Column 18, Line 41, in Claim 1, delete "communication" and insert -- communications --.

In Column 18, Line 51 (Approx.), in Claim 1, delete "where" and insert -- wherein --.

In Column 18, Line 53 (Approx.), in Claim 1, delete "$G_N^{\otimes\ log_2(L)}$," and insert -- $G_N^{\otimes log_2(L)}$, --.

In Column 18, Line 66, in Claim 2, delete "bit and/or" and insert -- bit, --.

In Column 18, Line 66, in Claim 2, after "frozen bit," insert -- or both, --.

In Column 19, Line 17, in Claim 7, delete "bit and/or" and insert -- bit, --.

In Column 19, Line 18, in Claim 7, delete "bit." and insert -- bit, or both. --.

In Column 19, Line 56, in Claim 11, delete "bit and/or" and insert -- bit, --.

In Column 19, Line 57, in Claim 11, after "bit," insert -- or both, --.

In Column 19, Line 65, in Claim 14, delete "encoding," and insert -- encoder, --.

In Column 20, Line 1, in Claim 14, delete "encoding" and insert -- encoder --.

In Column 20, Line 2, in Claim 14, delete "2L," and insert -- 2L --.

In Column 20, Line 10, in Claim 14, delete "where" and insert -- wherein --.

Signed and Sealed this
Fourth Day of April, 2023

Katherine Kelly Vidal
*Director of the United States Patent and Trademark Office*

CERTIFICATE OF CORRECTION (continued)

In Column 20, Line 12, in Claim 14, delete "$G_N^{\otimes \ log_2^{(L)}},$" and insert -- $G_N^{\otimes log_2^{(L)}}$, --.

In Column 20, Line 24 (Approx.), in Claim 15, delete "encoding module," and insert -- encoder, --.

In Column 20, Line 29 (Approx.), in Claim 16, delete "encoding module," and insert -- encoder, --.

In Column 20, Line 33 (Approx.), in Claim 17, delete "encoding module," and insert -- encoder, --.

In Column 20, Line 39 (Approx.), in Claim 18, delete "encoding module," and insert -- encoder, --.

In Column 20, Line 44 (Approx.), in Claim 19, delete "encoding module," and insert -- encoder, --.

In Column 20, Line 47 (Approx.), in Claim 20, delete "encoding module," and insert -- encoder, --.

In Column 20, Line 66, in Claim 21, delete "where" and insert -- wherein --.

In Column 21, Line 1, in Claim 21, delete "$G_N^{\otimes \ log_2^{(L)}},$" and insert -- $G_N^{\otimes log_2^{(L)}}$, --.

In Column 21, Line 25 (Approx.), in Claim 22, delete "where" and insert -- wherein --.

In Column 21, Line 25 (Approx.), in Claim 22, delete "$u_{L\ 1}$" and insert -- $u_{L-1}$ --.

In Column 21, Line 25 (Approx.), in Claim 22, delete "$u_{2L\ 1}$" and insert -- $u_{2L-1}$ --.

In Column 21, Line 25 (Approx.), in Claim 22, delete "$u_{L|1}$}," and insert -- $u_{L+1}$}, --.

In Column 21, Line 26 (Approx.), in Claim 22, delete "$c_{L\ 1}$" and insert -- $c_{L-1}$ --.

In Column 21, Line 26 (Approx.), in Claim 22, delete "$c_{2L\ 1}$" and insert -- $c_{2L-1}$ --.

In Column 21, Line 26 (Approx.), in Claim 22, delete "$c_{L|1}$}," and insert -- $c_{L+1}$}, --.

In Column 21, Line 26 (Approx.), in Claim 22, delete "$G_N^{\otimes \ log_2^{(L)}},$" and insert -- $G_N^{\otimes log_2^{(L)}}$, --.

In Column 21, Line 42 (Approx.), in Claim 23, delete "L=2n," and insert -- $L=2^n$, --.

In Column 22, Line 13 (Approx.), in Claim 24, delete "L=2n," and insert -- $L=2^n$, --.

In Column 22, Line 37 (Approx.), in Claim 25, delete "$L=2^n$" and insert -- $L=2^n$, --.